(12) United States Patent
Kaneko

(10) Patent No.: US 7,701,226 B2
(45) Date of Patent: *Apr. 20, 2010

(54) SYSTEMS AND METHODS FOR DETERMINING THE STATE OF A PROGRAMMABLE FUSE IN AN IC

(75) Inventor: Masaaki Kaneko, Round Rock, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

This patent is subject to a terminal disclaimer.

(21) Appl. No.: 11/772,882

(22) Filed: Jul. 3, 2007

(65) Prior Publication Data
US 2009/0009186 A1 Jan. 8, 2009

(51) Int. Cl.
*G01R 31/02* (2006.01)
(52) U.S. Cl. .................. 324/550; 324/713; 327/525; 365/225.7; 257/529
(58) Field of Classification Search .................. 324/550
See application file for complete search history.

(56) References Cited

U.S. PATENT DOCUMENTS 6,972,614 B2    12/2005    Anderson, II
7,405,590 B1 *  7/2008     Kaneko ........................ 326/38
7,474,106 B2 *  1/2009     Kanno ......................... 324/713
7,501,879 B1 *  3/2009     Oh et al. ...................... 327/525
2002/0031024 A1 *  3/2002  Horiguchi et al. ............ 365/200
2007/0133333 A1 *  6/2007  Hovis et al. ............... 365/225.7

* cited by examiner

*Primary Examiner*—Timothy J Dole
*Assistant Examiner*—Benjamin M Baldridge
(74) *Attorney, Agent, or Firm*—Law Offices of Mark L. Berrier

(57) ABSTRACT

Systems and methods for detecting the mode (a.k.a., state) of a fuse or set of fuses in a device such as an integrated circuit. One embodiment comprises a method for determining three fuse states (uncut, cut, and destroyed) by comparing the fuse voltage with two reference voltages. Each fuse state has a different (indicative) impedance and is associated with a fuse voltage. The fuse voltage is below, between, or above two reference voltages, thereby determining the fuse state. One embodiment includes the fuse in series with a read transistor as well as two reference voltage generators, each comprising a resistor and a transistor (equivalent to the read transistor). Both resistors' impedances are greater than the uncut fuse impedance and one is less than the cut fuse impedance. Two comparators are used to bracket the fuse voltage, indicating that the fuse is uncut, cut, or destroyed.

17 Claims, 6 Drawing Sheets

SYSTEMS AND METHODS FOR DETERMINING THE STATE OF A PROGRAMMABLE FUSE IN AN IC

BACKGROUND

1. Field of the Invention

The invention relates generally to fuses in integrated circuits (IC's) and more particularly to systems and methods for detecting the state of a fuse or set of fuses that are used to persistently store data in an IC.

2. Related Art

It is sometimes necessary to maintain some device specific information for a device such as integrated circuit (IC). It is convenient if not necessary to store this information in the IC itself. In order to do this, some part of the circuitry must act as a persistent storage. One solution is to incorporate into the circuitry a set of fuses and encode the desired information by programming it into the fuses. There are various trade-offs in the choice of components for this task, such as size, ease of programming, persistence etc.

One conventional method is to incorporate laser fuses into a device. These fuses are programmed by evaporating the fuses' metal links (in other words, the fuses are "cut"). The programmed information is then read by determining which of the fuses have been cut and which have not. Cut fuses may, for example, be interpreted as 0's, while uncut fuses may be interpreted as 1's. The programming is permanent.

The opportunities to program laser fuses are limited to a small window of time in the manufacturing process when the fuses are exposed. An additional limitation on the use of this type of fuse is the minimum size of such fuses. This is a limitation because of the wavelength of the laser. The wavelength of the laser is typically large relative to the feature size of contemporary IC's, so the laser may not be able to accurately cut the fuses. The use of a laser to cut the fuses may also cause unintended collateral damage.

An alternative to laser fuses is electrically programmable fuses such as Ti-Silicide or other metal-silicide fuses. These (and fuses of similar construction) may also be referred to as poly fuses or eFuses. An eFuse is programmed by passing a large current through the fuse to "cut" it. The mechanism underlying the programming of an (metal-silicide) eFuse is based on the agglomeration of the material of a silicide layer in the fuse. The agglomeration occurs when the current density (and temperature) are sufficient to bring about an appropriate degree of electromigration. These fuses are smaller and more readily programmed than laser fuses. An eFuse can be programmed at a more convenient stage in the manufacturing process, or at some time well after manufacturing. Also, the potential for collateral damage is decreased (with proper programming).

Electromigration is the mass transport caused by the (gradual) migration of the ions in a conductor due to the momentum exchange between moving (conducting) electrons and nearby diffusing metal atoms (ions). Over a period of time a sufficient number of atoms are forced far from their original positions, and gaps (voids) are created, restricting or preventing conduction. Agglomeration refers to the piling up of the migrating atoms.

Normally, electromigration does not occur in semiconductors, but instead occurs in an IC's metal interconnects. Designers have taken advantage of this effect by constructing fuse components out of appropriately affected materials such as Ti-Silicide, which can then be subjected to high currents/voltages to program the fuses. However, when the current is too large or applied for too long, the fuse can be damaged or even destroyed. Other problems may arise. For example, in some cases, a short circuit can occur in nearby components.

An eFuse, both in its unprogrammed, unaltered (a.k.a. uncut) state and properly programmed (a.k.a., cut) state, carries a current and has an impedance in a specified range. If the fuse is programmed with current that is too high, the fuse can be damaged or even destroyed, leaving it with an impedance well outside the desired range(s). There is also the potential for collateral damage to other components in the device.

A conventional read circuit can distinguish between an unprogrammed (uncut) and programmed (cut) fuse, but cannot identify an improperly programmed (destroyed) fuse. It is, however, important to be able not only to read the fuse, but also to determine whether the fuse has been destroyed. It would therefore be desirable to provide systems and methods to distinguish between the three fuse states: uncut; cut; and destroyed.

SUMMARY OF THE INVENTION

One or more of the problems outlined above may be solved by the various embodiments of the invention. Broadly speaking, the invention includes systems and methods for detecting the mode (a.k.a., state) of a fuse or set of fuses in a device (for example, in an integrated circuit). The fuse can be in any one of a set of states which can be determined by passing a current through the fuse, measuring the voltage (or voltage drop) and then comparing the voltage to a set of reference values.

Although a fuse which is in any of the possible states may be considered programmed in that it stores a bit of information, the term "programmed" is used herein primarily to refer to the programmed or cut state in which the fuse's impedance has been increased above an uncut or unprogrammed level, but has not been destroyed.

One embodiment comprises a method for determining a fuse state (one of at least three), each state having a different impedance value. The three progressively larger impedances are indicative of an uncut fuse, a cut fuse, and a destroyed fuse, respectively. The fuse state is determined by its impedance, whether the fuse impedance is in the range of the first value (unprogrammed), second value (programmed), or third value (destroyed). A fuse read signal (FOUT) is then generated. This signal is deasserted when the fuse impedance is less than the second value and is asserted otherwise. A fuse fail signal (FAIL) is also generated, where the signal is asserted when the fuse impedance is greater than the second value and is deasserted otherwise.

In one embodiment, a fuse voltage is generated based on the fuse impedance. The method determines whether the fuse voltage is below, between, or above two reference voltages (e.g., VREF, VREF2) and thereby determines whether the fuse impedance is in the range of an uncut fuse, a cut fuse, or a destroyed fuse, respectively. Fuse read signal (FOUT) and fuse fail signal (FAIL) are again used to indicate the fuse state. FOUT is asserted when the fuse voltage is greater than the lower reference and FAIL is asserted when the fuse voltage is greater than the higher voltage reference. When neither signal is asserted, the fuse is uncut. When FOUT is asserted and FAIL is not asserted, the fuse is cut. When FAIL is asserted, the fuse is destroyed.

In one embodiment, the method determines fuse impedance using voltage drops across the fuse and two reference components. For the reference voltages (VREF, VREF2), a voltage drop is measured across reference components such as resistors. One reference component's impedance is between that of an uncut fuse and a cut fuse. The second reference component's impedance is between that of a cut fuse and a destroyed fuse. The fuse voltage drop is compared to the reference voltage drops and the corresponding fuse read and fail signals are generated. In some embodiments there are multiple fuses, and their fail signals are combined (e.g., using OR gates). This can be done is such a way that when any of the fuses are destroyed, a single fail signal is asserted.

One embodiment of a fuse read circuit includes a fuse, two reference voltage generators, and two comparators. The fuse impedance has a relatively low value when unprogrammed (in the uncut state), a high value when properly programmed (in the cut state), and an even higher value when improperly programmed (in the destroyed state). The fuse voltage varies with the fuse impedance and can be bracketed into one of the three states using reference voltages generated by two reference generators. Each of the two voltage generators is configured to generate a reference voltage (e.g., VREF or VREF2) corresponding to impedances (voltages) between those of the fuse states. There are also two comparators, each used to compare the fuse voltage with one of the reference voltages. One comparator uses the lower voltage reference and indicates whether or not the fuse has been programmed (cut or destroyed). The other comparator uses the higher voltage reference and indicates whether or not the fuse has been destroyed. The impedance values for the uncut, cut and destroyed fuses may, for example, be R, 10R and 1000R, respectively, where R is a resistance value. The impedance values for the lower reference and higher reference resistors may, for instance, be 5R and 500R, respectively.

In some embodiments, the fuse and reference voltages are voltage drops. In one embodiment, three read transistors are included. One transistor is in series with each reference generator's resistor and one is in series with the fuse. The three transistors are substantially the same and are switched on to "read" the fuse state. Since the transistors are substantially the same, the voltage drops across the fuse and reference resistors vary with their respective impedances. In one embodiment, the fuse is also connected in series with an additional transistor. This additional transistor is a write transistor and is connected in parallel with the Fuse's read transistor. The write transistor is used in programming the fuse. It is selectively switched on by a write signal (WR) and has an impedance which is less than that of the other three transistors so that a higher current will be generated, thereby writing (programming) the fuse. In yet another embodiment, the read circuit also includes an OR gate configured to receive the fuse fail signal and a fail signal from a different fuse. The output of the OR gate is asserted if either of the input signals is asserted. In one embodiment, multiple read circuits are connected in series with the fail signals of each coupled to the successive read circuit's OR gate. When an OR gate is included in the initial read circuit, one input of the OR gate is tied to ground instead of receiving a preceding read circuit's fail signal. The final fail signal is monitored to determine if the programming of any fuse failed (a.k.a., if any fuse was destroyed). In one embodiment, the final fail signal can be used to optimize the programming supply voltage so that all fuses are properly programmed.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
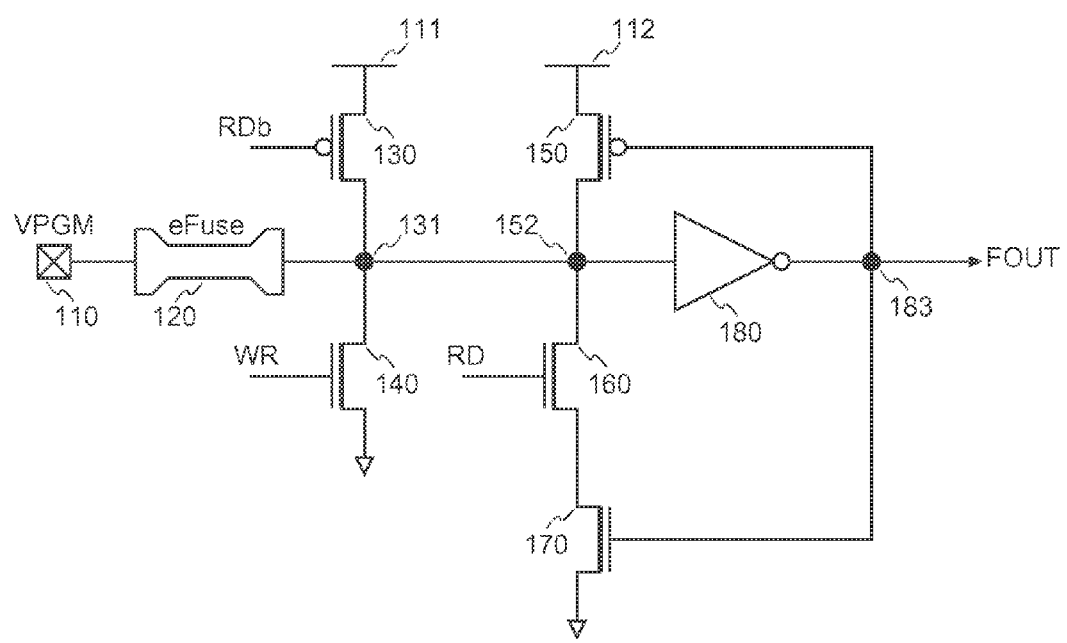
FIG. 1 is a functional block diagram illustrating a latch type programming-detection circuit in accordance with the prior art.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

Broadly speaking, the invention includes systems and methods for detecting the state of a fuse or set of fuses in a device such as an integrated circuit. The fuse can be in any one of a set of states which can be determined by passing a current through the fuse, measuring the corresponding voltage (or voltage drop) and then comparing the voltage to a set of reference values.

Before describing the invention in detail, it is helpful to understand how a fuse is programmed. This generally entails directing a large current through a fuse in such a way as to drive up the impedance. Typically, this increase is achieved through damage to the fuse itself. In a simple fuse, a conductive (metal) link is melted or evaporated by an excessive current, making the fuse completely non-conductive (i.e., opening the circuit). As noted above, in a laser fuse, the metal link is evaporated using laser heating. Also described above, in an eFuse, a programming current is designed to cause an agglomeration of at least a portion of the conductive material in the fuse, thereby increasing its impedance (though not creating an open circuit).

FIG. 1 illustrates a conventional latch-type circuit used to program and read an eFuse (poly fuse). The figure shows voltage sources 110, 111, 112, eFuse 120, transistors 130, 140, 150, 160, 170, and inverter 180. PMOS transistor 130 and NMOS transistor 140 are connected (at node 131) between supply voltage 111 and ground. PMOS transistor 150 and NMOS transistors 160 and 170 are connected in series. Transistors 150 and 160 are connected at node 152. Connected in series are voltage source 110, eFuse 120, nodes 131 and 152, inverter 180 and node 183. The output is FOUT at node 183, which is connected to the inputs of transistors 150 and 170. The inputs to transistors 130, 140, and 160 are RDb, WR, and RD, respectively. RDb is the inverse of RD.

As noted above, eFuses are programmed by selectively changing their impedances. The fuses are read by passing a relatively low current through them and reading the voltage drops across them to determine their impedances. The eFuses are written (programmed) by passing a higher current through them. This programming current should be high enough to agglomerate the silicide layer, but low enough that the fuse (and possibly neighboring components) are not destroyed.

Source 110 provides the necessary high voltage/current when programming and acts as ground (i.e., 0 volts) when reading. To program eFuse 120, signal WR is asserted (high) so that NMOS transistor 140 is switched on, and signal RD is deasserted (low) so that PMOS transistors 130 and 150 are switched off. The current flows through eFuse 120 to ground through transistor 140, causing eFuse 120 to be cut (or, possibly destroyed). To read eFuse 120, signal RD is asserted (high) so that PMOS transistors 130 and 150 are switched on, and signal WR is deasserted so that NMOS transistor 140 is switched off. When eFuse 120 is uncut (i.e., not programmed), its impedance is low and the input voltage to inverter 180 is low. The output of inverter 180 is therefore high, switching transistor 170 on and switching transistor 150 off, thereby coupling the input of inverter 180 to ground through transistors 160 and 170 and reinforcing the low input signal. When eFuse 120 is cut (or destroyed) its impedance is high and the input voltage to inverter 180 is high. The output of inverter 180 is therefore low, switching transistor 150 on and switching transistor 170 off. This couples the input of inverter 180 to voltage source 110, reinforcing the high input signal. Thus, when the eFuse is cut or destroyed, FOUT is low, and when the eFuse is uncut, FOUT is high. Note that this circuit cannot distinguish a properly programmed (cut) eFuse from an improperly programmed (destroyed) eFuse—both states produce the same low output signal.

The term "uncut" is used herein to describe an unaltered, unprogrammed fuse and is characterized by a low impedance (e.g., R). The term "cut" is used to describe a properly programmed fuse characterized by an elevated, bounded impedance (e.g., 10R). The term "destroyed" is used to describe an improperly programmed fuse characterized by a large increase in impedance, typically well above that of a cut fuse (e.g., 1000R). Programming that causes a fuse to be "destroyed" may not sever the circuit and it may, or may not, damage surrounding components.

Figure 2:
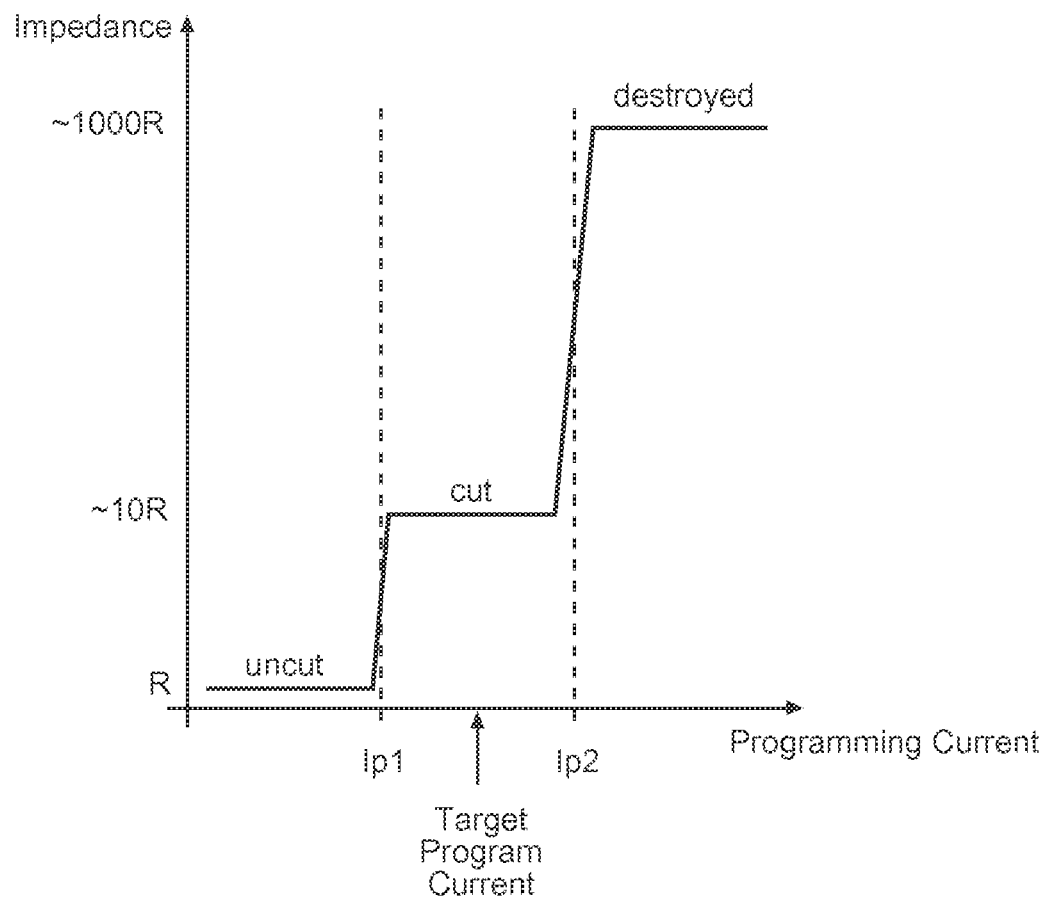
FIG. 2 is a plot illustrating an example of fuse impedance as a function of programming current.

FIG. 2 illustrates an exemplary relationship between programming current and programmed impedance. There are three regions: uncut; cut; and destroyed. In its unprogrammed, uncut state, an eFuse has a base impedance of R. When an appropriate programming current is applied to the fuse (between Ip1 and Ip2) during a fuse write operation, the silicide layer of the fuse will be agglomerated, increasing the impedance of the fuse to a desired range around 10R. The fuse is then considered cut. If the programming current is too low (less than Ip1), the eFuse is not cut, and the resulting impedance will remain at about R. If the programming current is too high (greater than Ip2), the eFuse is destroyed and the impedance of the fuse is much greater than 10R (approximately 1000R). Only when the programming current is within an appropriate range (between Ip1 and Ip2) does the fuse write operation result in the desired agglomeration and impedance (i.e., 10R).

Figure 3:
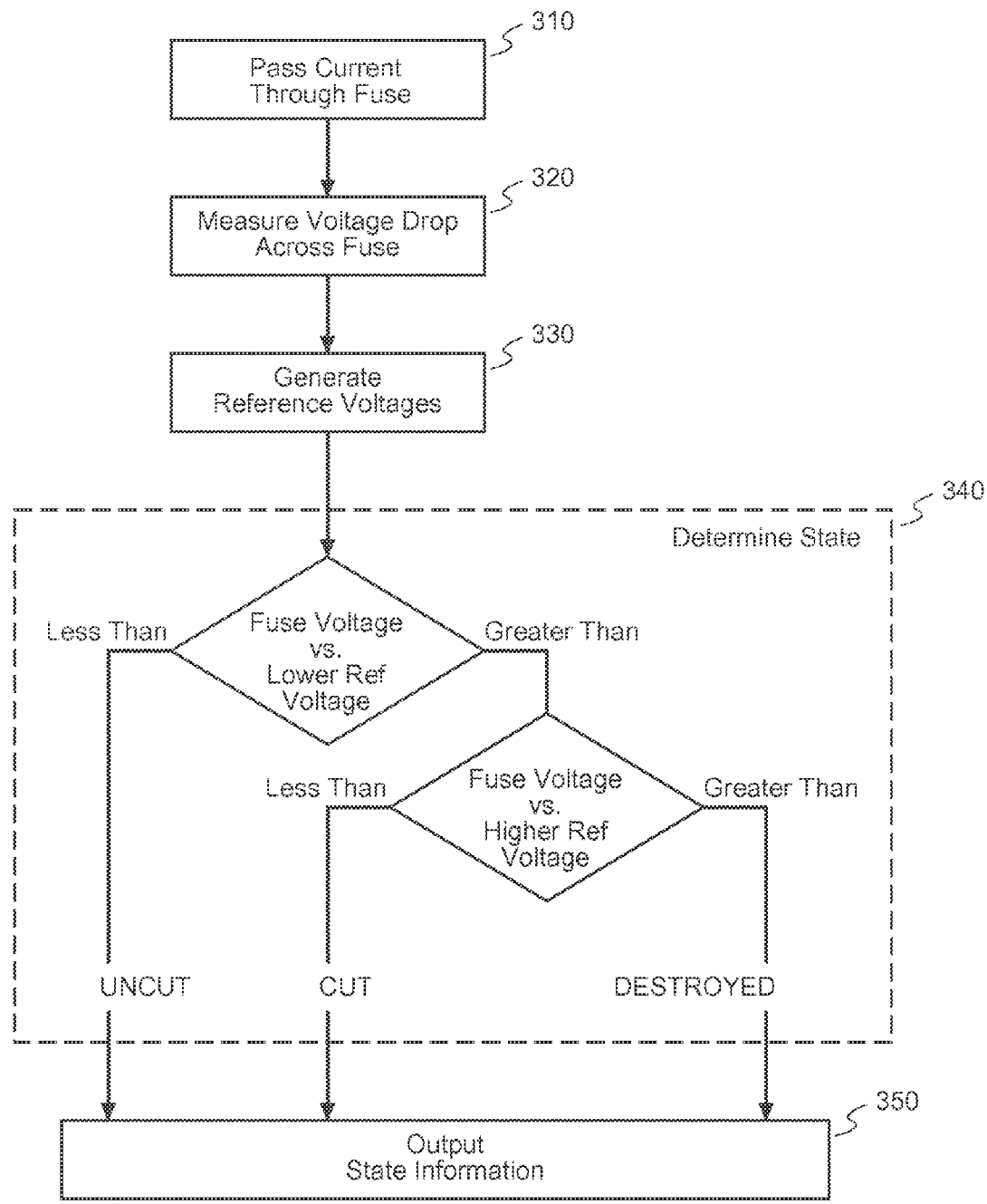
FIG. 3 is a flowchart of a method to identify fuse states in accordance with one embodiment.

As mentioned above, a conventional read circuit cannot distinguish between an eFuse's cut and destroyed states. FIG. 3 is a flowchart of a method used to identify the three eFuse states in accordance with one embodiment. First, a current is passed through the eFuse (block 310). The voltage drop across the fuse is then measured (block 320). Two reference voltages (voltage drops) are then generated (measured) (block 330). The reference voltages correspond to impedance values that lie between those of the three eFuse states (R, about 10R, and about 1000R). The voltage drop across the eFuse is then compared to each of the two reference voltages to determine the state of the eFuse (block 340). If it is determined that the fuse impedance is lower than both of the references', then the fuse has not been programmed (i.e., it is uncut). If the fuse impedance is less than one reference and greater that the other, the fuse has been programmed properly (i.e., it is cut). If it is determined that the fuse impedance is greater than both reference voltages, then the fuse has been programmed improperly (i.e., it has been destroyed). The state information can them be output to a user (block 350).

Figure 4A:
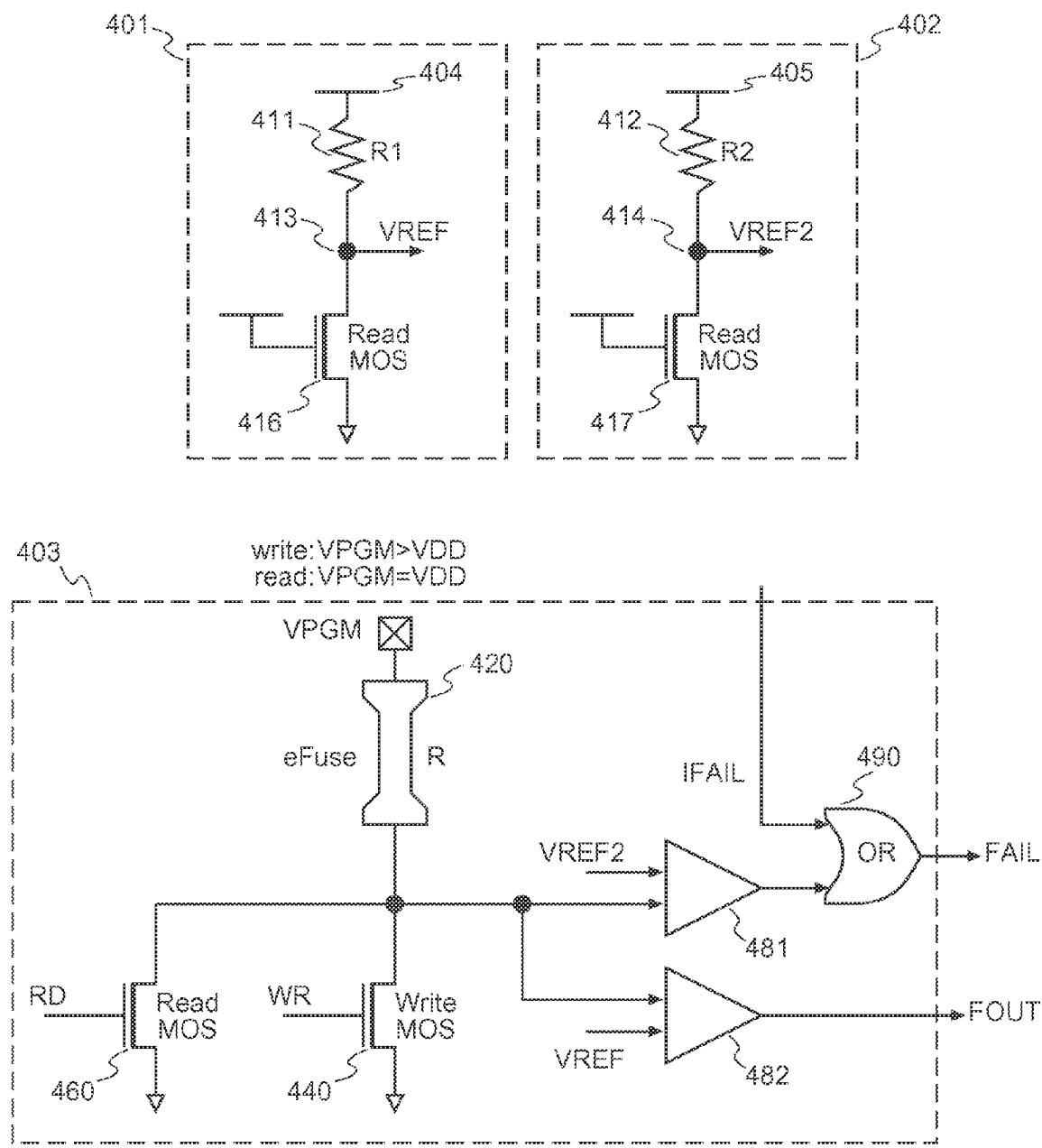
FIG. 4A is a functional block diagram illustrating a circuit configured to identify fuse states in accordance with one embodiment.

FIG. 4A illustrates circuitry configured to implement the method embodied in the flowchart of FIG. 3. Illustrated are reference voltage generation circuitry (401, 402) and mode (state) detection circuitry (403). Each reference voltage generator (401, 402) includes a resistor (411, 412) and a transistor (416, 417). The resistor and switching transistor of each voltage generator are connected in series between a supply voltage and ground.

Voltage generator 401 corresponds to a lower resistance and includes resistor 411, which has a resistance R1 (e.g., 5R) which is between the resistance of an uncut fuse (e.g., R) and the resistance of a cut fuse (e.g., 10R). Resistor 411 is coupled to transistor 416 at node 413. Reference voltage VREF is taken at node 413. Voltage generator 402 corresponds to a higher resistance and includes resistor 412, which has a resistance R2 (e.g., 500R) that is between the resistance of a cut fuse (e.g., 10R) and the resistance of a destroyed fuse (e.g., 1000R). Resistor 412 is coupled to transistor 417 at node 414. Reference voltage VREF2 is taken at node 414. The supply voltage is the same for each of the reference voltage generators, and is applied to the gates of transistors 416 and 417 so that they remain switched on. It should be noted that, when NMOS transistors 416, 417 and 460 have the same impedance, R1 and R2 should be R<R1<10R<R2<1000R (where uncut, cut and destroyed fuses have impedances of R, 10R and 1000R, respectively.) When NMOS transistors 416, 417 and 460 do not have the same impedances, the reference impedance values R1, R2 must be chosen to accommodate the different transistor impedances.

Figure 5:
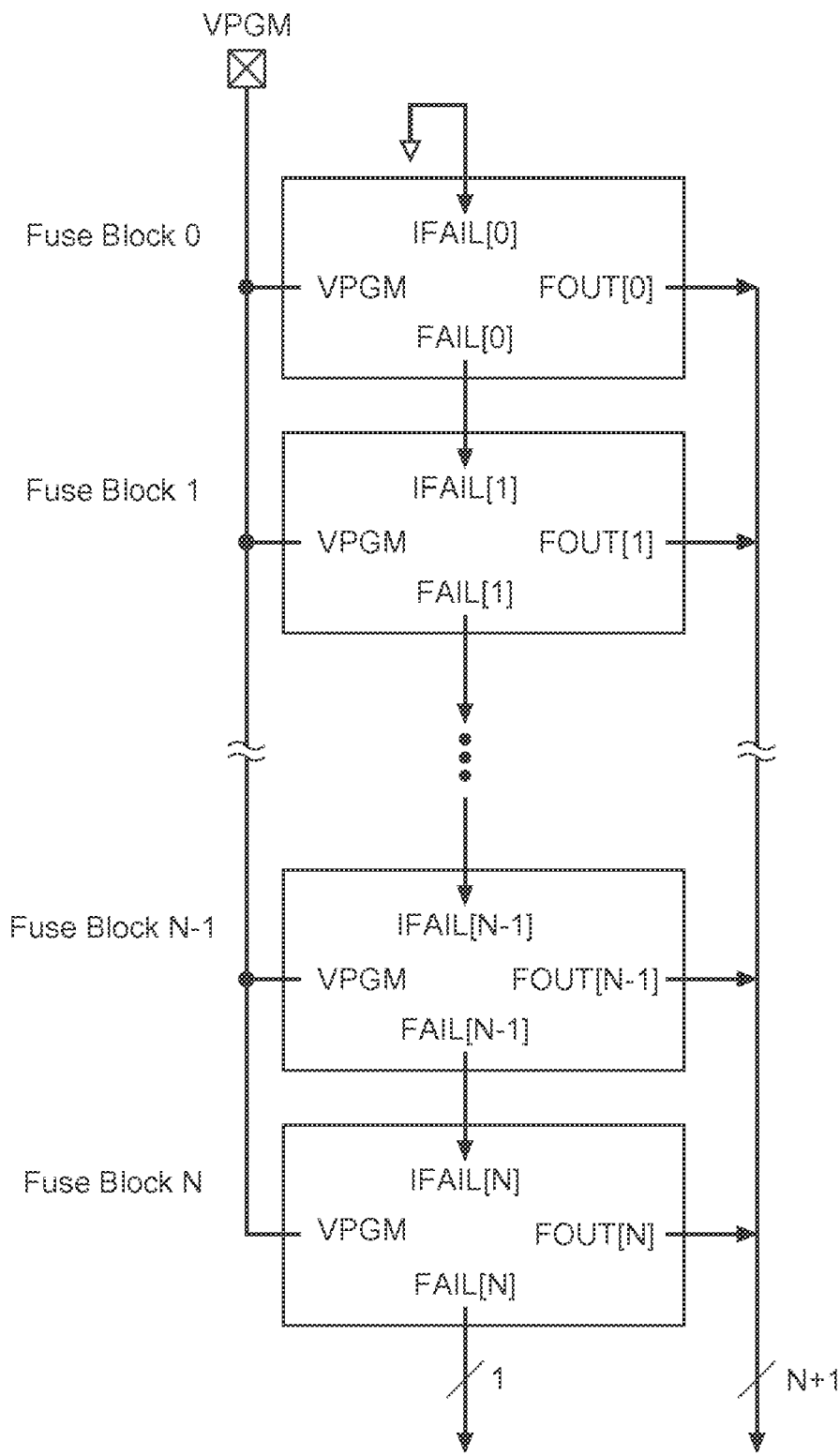
FIG. 5 is a functional block diagram illustrating a connected array of mode detection circuits as in one embodiment.

The components of mode detection circuitry 403 include eFuse 420, transistors 440 and 460, comparators 481 and 482, and OR gate 490. eFuse 420 is coupled between the supply voltage and node 415. Node 415 can be alternately coupled to ground through either transistor 460 or transistor 440. Node 415 is coupled to the inputs of both comparator 481 and comparator 482. The voltage generators are coupled to the other inputs of the comparators. VREF and VREF2 are used by comparators 481 and 482, respectively. The outputs of comparator 481 and 482 are FOUT and FOUT2, respectively. FOUT2 and IFAIL are coupled to OR 490. IFAIL is an output of another block of fuse circuitry identical to mode detection circuitry 403. The output of OR 490 is FAIL. (FIG. 5 illustrates a daisy chain of fuse blocks.)

Voltage generators 401 and 402 provide reference voltages VREF and VREF2, respectively, used in comparisons with VF, the voltage at node 415. The impedances of the resistors in reference voltage generators 401 and 402 are intermediate to those of the eFuse. That is, they fall between the possible eFuse impedances (corresponding to the fuse being uncut, cut, and destroyed). For example, the resistances corresponding to each of: the base eFuse uncut state, the lower-resistance generator 401, the eFuse cut state, the higher-resistance generator 402, and the eFuse destroyed state may be: R, 5R, 10R, 500R, and 1000R, respectively.

When the circuit (eFuse) is to be read, RD is asserted, switching transistor 460 on (WR is not asserted, switching transistor 440 off). As illustrated in voltage generators 401 and 402, the input of each switching (read) transistor is connected to the power supply, enabling both (i.e., switching both on). It should also be noted that the conductances of transistors 416, 417 and 460 are the same, and this conductance is higher than that of transistor 440, thereby making the write current greater than the read current.

Comparator 481 has as its inputs, VF and VREF. When VF is less than VREF, FOUT is low. When VF is greater than VREF, FOUT is high. Comparator 482 has as its inputs, VF and VREF2. When VF is less than VREF2, FOUT2 is low. When VF is greater than VREF2, FOUT is high. Thus, comparator 481 determines whether or not eFuse 420 has been programmed and comparator 482 determines whether eFuse 420 has been programmed properly or destroyed. As a result, when the fuse is in its uncut state, FOUT and FOUT2 are both 0. When the fuse is cut, but not destroyed, FOUT and FOUT2 are 0 and 1, respectively. When the fuse is destroyed, FOUT and FOUT2 are 1 and 1, respectively.

OR gate 490 combines the output of comparator 481 with an IFAIL signal from the mode detection circuitry of a previous eFuse. The output of comparator 481, when asserted, indicates that eFuse 420 has been destroyed. The received IFAIL signal, when asserted, indicates that the eFuse of one of the previous eFuses has been destroyed. Thus, if any one of the chained eFuses has been destroyed, OR gate 490 asserts the FAIL signal. The results from a number of mode detection circuits are thereby combined so that only one FAIL signal needs be checked to ensure that none of the connected fuses have been improperly programmed.

Figure 4B:
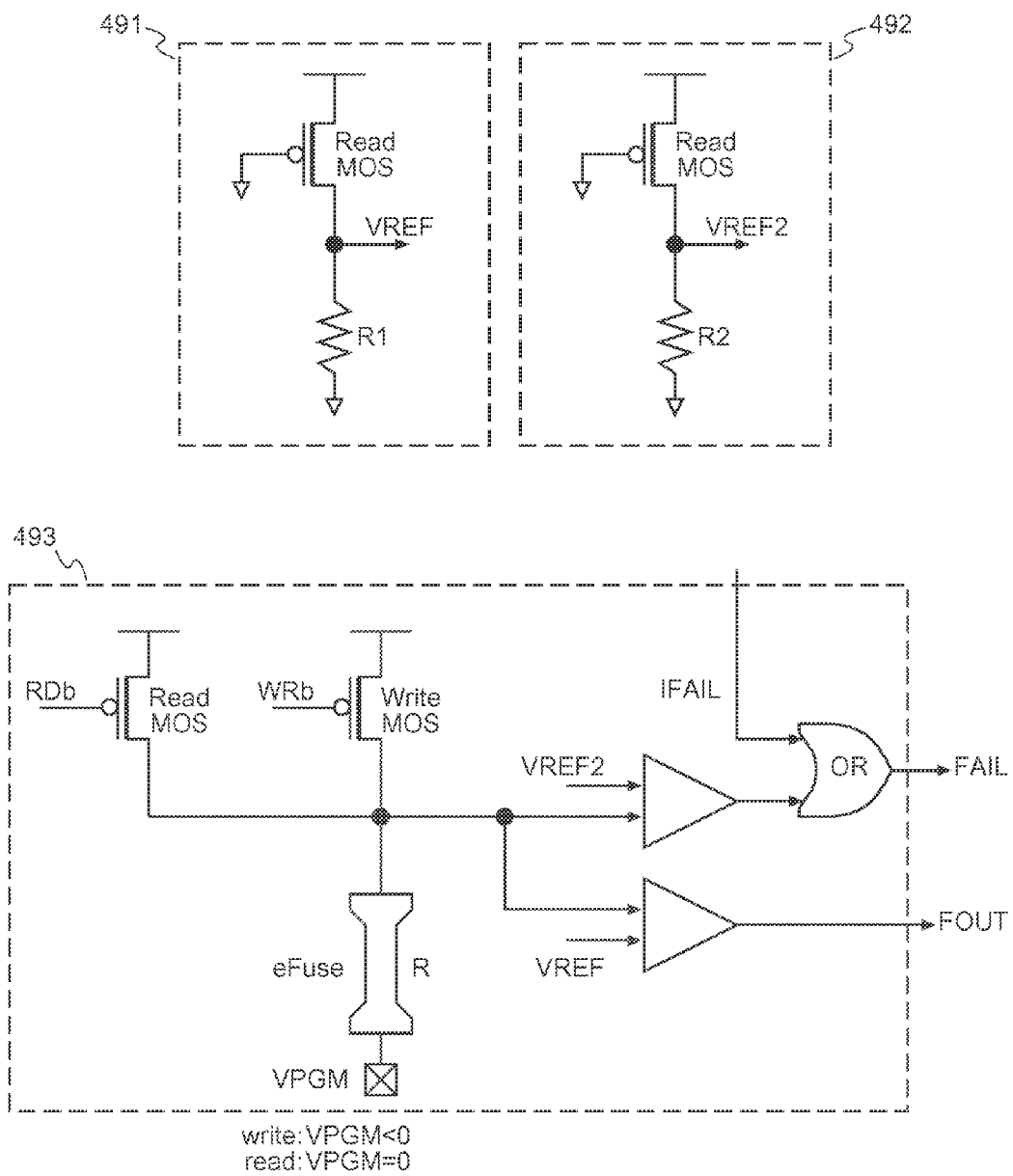
FIG. 4B is a functional block diagram illustrating a circuit configured to identify fuse states in accordance with an alternative embodiment.

There are many possible variations. FIG. 4B is an alternative embodiment of circuitry configured to identify fuse states. Illustrated are reference voltage generation circuitry (491, 492) and mode (state) detection circuitry (493), each corresponding to those of FIG. 4A (401, 402, and 403, respectively). However, PMOS transistors are used and their coupled inputs are inverted. Also, while the resistor and switching transistor of each voltage generator are also connected in series between a supply voltage and ground, the order is reversed. That is, the order is power supply, transistor, resistor (fuse) and ground (VPGM).

FIG. 5 illustrates a connected array of mode detection circuits (fuse blocks) as in one embodiment. Illustrated is a daisy chain of N+1 fuse blocks. The chain begins with fuse block 0 and ends with fuse block N. Each fuse block in this embodiment is configured identically to mode detection circuit 403 and therefore has two outputs: FOUT and FAIL. FOUT[i] and FAIL[i] correspond to the ith fuse block. The blocks are connected such that FAIL[i]=IFAIL[i+1] for i from 0 to N−1. That is, the FAIL signal of a fuse block is passed to the successive fuse block in the chain. IFAIL[0] is low since there are no preceding fuse blocks. Each fuse block uses an OR gate (such as OR gate 490) to compare/combine the block's FOUT2 with the previous fuse block's IFAIL. If either (or both) is high, the result is that FAIL is high. FAIL is low otherwise. The last signal in the chain, FAIL[N], is examined to determine if any of the fuses of the chain have been improperly programmed. When FAIL[N] is high, at least one fuse has been destroyed. In another embodiment, the final fail signal FAIL[N] is monitored to optimize the programming supply voltage VPGM. For example, when FAIL[N] is asserted using VPGM=2.0V, but not asserted using VPGM=1.9V, then the programming supply voltage should be no more than 1.9V (e.g., VPGM=1.7V).

While the foregoing description presents several specific exemplary embodiments, there may be many variations of the described features and components in alternative embodiments. For example, each fuse may have a companion fuse to be used when the first fuse is destroyed. Other types of multistate fuses can be used. These could include fuses with more than two working states enabling the use of alternatives to a binary encoding of information. The voltage or voltage drops can be determined in a various ways such as by a differential amplifier coupled to the fuse or reference component(s). The fuse read circuit outputs may be encoded or multiplexed. Many other variations will also be apparent to persons of skill in the art of the invention upon reading the present disclosure.

Those of skill in the art will understand that information and signals may be represented using any of a variety of different technologies and techniques. For example, data, instructions, commands, information, signals, bits, symbols, and the like that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software (including firmware,) or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A method for determining a fuse state comprising:
providing a fuse that has a resistance which is a first value when unprogrammed, a second value when programmed, and a third value when destroyed, wherein the second value is greater than the first value, and the third value is greater than the second value;
determining whether the fuse resistance has the first, second or third values, wherein said determining comprises:
generating a first reference voltage drop across a first reference component having a first reference resistance, wherein the first reference resistance is greater than the first value and less than the second value;
generating a second reference voltage drop across a second reference component having a second reference resistance, wherein the second reference resistance is greater than the second value and less than the third value;
determining a fuse voltage drop across the fuse; and
determining that the fuse resistance has the first value when the fuse voltage drop is less than the first reference voltage drop. has the second value when the fuse voltage drop is greater than the first reference voltage drop and less than the second reference voltage drop, and has the third value when the fuse voltage drop is greater than the second reference voltage drop,
generating a fuse read signal that is deasserted when the fuse resistance is the first value and is asserted otherwise; and
generating a fuse fail signal that is asserted when the fuse resistance is greater than the third value and is deasserted otherwise.

2. The method of claim 1, wherein generating the first and second reference voltage drops comprises passing a current through first and second reference resistors, respectively.

3. The method of claim 1 further comprising:
receiving an ifail signal indicative of whether a preceding fuse has been destroyed; and
OR'ing the fail signal and the ifail signal, and
providing the result of the OR'ing as an output fail signal.

4. The method of claim 1, further comprising providing the fail signal as an output.

5. The method of claim 1, wherein the fuse is programmable by passing a current through the fuse to alter the fuse resistance.

6. A fuse read circuit for determining a fuse state, comprising:
a fuse that has a resistance which is a first value when unprogrammed, a second value when programmed, and a third value when destroyed, wherein the second value is greater than the first value, and the third value is greater than the second value and wherein the fuse is coupled to a supply voltage;
a first reference voltage generator that generates a first reference voltage, wherein the first reference voltage generator comprises a first resistor coupled to the supply voltage and wherein the first reference voltage comprises the supply voltage, minus a voltage drop across the first resistor;
a second reference voltage generator that generates a second reference voltage, wherein the second reference voltage is greater than the first reference voltage, and wherein the second reference voltage generator comprises a second resistor coupled to the supply voltage and wherein the second reference voltage comprises the supply voltage, minus a voltage drop across the second resistor;
a first comparator that compares a fuse voltage which varies with the fuse resistance to the first reference voltage, wherein the fuse voltage comprises the supply voltage, minus a voltage drop across the fuse, and wherein an output of the first comparator generates a fuse read signal that indicates whether or not the fuse has been programmed;
a second comparator that compares the fuse voltage to the second reference voltage, wherein an output of the second comparator generates a fail signal that indicates whether or not the fuse has been destroyed.

7. The fuse read circuit of claim 6,
wherein the first resistor has a resistance which is greater than the first value and less than the second value, and wherein the second resistor has a resistance which is greater than the second value and less than the third value.

8. The fuse read circuit of claim 6,
wherein the first resistor is connected in series with a first transistor between the supply voltage and ground;
wherein the second resistor is connected in series with a second transistor between the supply voltage and ground;
wherein the fuse is connected in series with a third transistor between the supply voltage and ground; and
wherein the first, second and third transistors have substantially identical electrical characteristics.

9. The fuse read circuit of claim 8,
wherein the fuse is connected in series with a write transistor which is connected between the supply voltage and ground, in parallel with the third transistor, and wherein the write transistor's series resistance is less than the series resistance of the first, second and third transistors when the write transistor is selectively switched on by a write signal.

10. The fuse read circuit of claim 6, wherein the second value is about 10 times the first value, and the third value is about 1000 times the first value.

11. The fuse read circuit of claim 10, wherein the first resistor has a resistance which is about 5 times the first value, and the second resistor has a resistance which is about 500 times the first value.

12. The fuse read circuit of claim 6,
wherein the fuse read signal is asserted by the first comparator when the first reference voltage is greater than the fuse voltage and
wherein the fail signal is asserted by the second comparator when the second reference voltage is greater than the fuse voltage.

13. The fuse read circuit of claim 6, further comprising:
an OR gate configured to receive the fail signal from the second comparator as a first input and a fail signal from a different fuse read circuit as a second input;
wherein an output of the OR gate is asserted when either of the fail signals is asserted, and the output of the OR gate is deasserted otherwise.

14. The fuse read circuit of claim 13 further comprising:
two or more fuse read circuits connected in series;
wherein the second input to the OR gate is either
the output of the OR gate of an immediately preceding fuse read circuit or connected to ground when there is no preceding fuse read circuit.

15. The fuse read circuit of claim 6:
wherein the fuse voltage comprises a voltage drop across the fuse;
wherein the first reference voltage generator comprises
a first resistor and
wherein the first reference voltage comprises
a voltage drop across the first resistor;
wherein the second reference voltage generator comprises
a second resistor and
wherein the second reference voltage comprises
a voltage drop across the second resistor.

16. The method of claim 6,
wherein the fuse comprises a metal-silicide fuse having a silicide layer that is agglomerated by passing a high current therethrough.

17. A fuse read circuit for determining a fuse state, comprising:
a fuse,
a first reference voltage generator;
a second reference voltage generator;
a first comparator, and a second comparator,
wherein the fuse is connected in series with a read transistor's source and drain between the supply voltage and ground, and in series with a write transistor's source and drain between the supply voltage and ground,
wherein the read transistor and the write transistor are in parallel,
wherein the read transistor is selectively switched on by a read signal,
wherein the write transistor is selectively switched on by a write signal,
wherein when the write transistor is switched on, the write transistor has a resistance less than a resistance of the read transistor when the read transistor is switched on,
wherein the fuse has a resistance which is a first value when unprogrammed, a second value when programmed, and a third value when destroyed, wherein the second value is greater than the first value, and the third value is greater than the second value;
wherein the first reference voltage generator includes a first reference resistor and a first reference transistor connected in series between the supply voltage and ground, wherein the first reference resistor has a resistance which is greater than the first value and less than the second value,
wherein the first reference transistor and the read transistor have substantially identical electrical characteristics;
wherein the first reference voltage generator is configured to output a voltage at a node between the first reference resistor and the first reference transistor as a first reference voltage;
wherein the second reference voltage generator includes a second reference resistor and a second reference transistor connected in series between the supply voltage and ground,
wherein the second reference resistor has a resistance which is greater than the second value and less than the third value,
wherein the second reference transistor and the read transistor have substantially identical characteristics;
wherein the second reference voltage generator is configured to output a voltage at a node between the second reference resistor and the second reference transistor as a second reference voltage;
wherein the first comparator is configured when the read signal is asserted to compare a fuse voltage at a node between the fuse and the read transistor to the first reference voltage, wherein an output of the first comparator provides a fuse read signal that indicates whether or not the fuse has been programmed;
wherein the second comparator is configured to compare the fuse voltage to the second reference voltage, wherein an output of the second comparator provides a fail signal that indicates whether or not the fuse has been destroyed.

* * * * *